United States Patent
Lin

(10) Patent No.: US 6,348,399 B1
(45) Date of Patent: Feb. 19, 2002

(54) METHOD OF MAKING CHIP SCALE PACKAGE

(75) Inventor: Chun Hung Lin, Kaohsiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 0 days.

(21) Appl. No.: 09/610,857

(22) Filed: Jul. 6, 2000

(51) Int. Cl.⁷ .................................................. H01L 21/44
(52) U.S. Cl. ..................... 438/616; 438/108; 438/124; 438/126; 438/127; 438/614
(58) Field of Search ................................ 438/108, 118, 438/124, 125, 126, 127, 612, 613, 614, 616

(56) References Cited

U.S. PATENT DOCUMENTS

| | | | |
|---|---|---|---|
| 5,323,051 A | 6/1994 | Adams et al. | 257/417 |
| 5,620,928 A * | 4/1997 | Lee et al. | 438/118 |
| 5,656,550 A * | 8/1997 | Tsuji et al. | 438/123 |
| 5,830,800 A * | 11/1998 | Lin | 438/612 |
| 5,925,936 A | 7/1999 | Yamaji | 257/787 |
| 5,930,603 A * | 7/1999 | Tsuji et al. | 438/127 |
| 6,004,867 A | 12/1999 | Kim et al. | 438/459 |
| 6,204,559 B1 * | 3/2001 | Lin et al. | 257/738 |
| 6,238,952 B1 * | 5/2001 | Lin | 438/110 |

OTHER PUBLICATIONS

Molded Chip Scale Package for High Pin Count (1996 Electronic Components and Technology Conference) by Shinji Baba et al., pp. 1251–1257.

* cited by examiner

Primary Examiner—Kevin M. Picardat
(74) Attorney, Agent, or Firm—Reed Smith Hazel & Thomas LLP

(57) ABSTRACT

A method of making a chip scale package comprises the following steps: providing a semiconductor chip having a plurality of metal bumps formed on the active surface thereof; providing a metal plate having a plurality of flip-chip pads formed on a surface thereof; positioning the semiconductor chip on the surface of the metal plate with the metal bumps on the chip aligned with the flip-chip pads on the metal plate; connecting the metal bumps on the active surface of the semiconductor chip to the flip-chip pads on the surface of the metal plate; encapsulating the semiconductor chip against a portion of the surface of the metal plate; removing the metal plate while leaving the flip-chip pads intact; and forming a plurality of solder balls on the flip-chip pads. Using the technique of the present invention, it becomes possible that the manufacture of a molded chip scale package can be relatively simplified and economical, yet highly reliable.

8 Claims, 4 Drawing Sheets

METHOD OF MAKING CHIP SCALE PACKAGE

BACKGROUND OF THE INVENTION

1. Field of the Invention

This invention relates to a method of making a chip scale package, and more specifically to a method of making a molded chip scale package with a flip-chip configuration.

2. Description of the Related Art

As electronic devices have become more smaller and thinner, the velocity and the complexity of IC chip become more and more higher. Accordingly, a need has arisen for higher package efficiency. Demand for miniaturization is the primary catalyst driving the usage of advanced packages such as chip scale packages (CSP) and flip chips. Both of them greatly reduce the amount of board real estate required when compared to the alternative ball grid array (BGA) and thin small outline package (TSOP). Typically, a CSP is 20 percent larger than the chip itself. The most obvious advantage of CSP is the size of the package; that is, the package is slightly larger than the chip. Another advantage of CSP is that the package facilitates test and burn-in before assembly as an alternative to known good die (KGD) testing. In addition, CSP can combine many of the benefits of surface mount technology (SMT), such as standardization, encapsulation, surface mount, and reworkability, with the benefits of flip chip technology, such as low inductance, high I/O count, and direct thermal path.

However, CSP has at least one disadvantage compared to conventional BGA and TSOP, namely, high cost per unit. However, this problem could be eliminated if chip-sized packages could be mass produced more easily. Therefore, there is a need in the semiconductor packaging industry for CSP using mass production techniques at the wafer-level, as is illustrated in U.S. Pat. No. 5,323,051, U.S. Pat. No. 5,925,936 and U.S. Pat. No. 6,004,867.

Disclosed in the technical article by Baba et al. titled, "Molded Chip Scale Package for High Pin Count," Proceedings of the 46th ECTC, Orlando, Fla., 1996, pp. 1251–1257, is a process for making a CSP 100 (see FIG. 4) which is shown in greater detail in FIG. 5. As shown in FIG. 1, the IC chip 10 has a plurality of rerouted under bump metallurgy (UBM) 12 electrically connected to bonding pads on its active surface. First, copper lands 22 and inner solder bumps 24 are formed on a base frame 20 made of ferroalloy. The copper lands 22 are formed by plating and the inner solder bumps 24 are formed onto the copper lands 22 by stencil printing. Then, the chip 10 is attached onto the inner solder bumps 24 of the base frame 20, using flip chip bonding technology. Second, as shown in FIG. 2, the bonded chip 10 and portions of the frame 20 are encapsulated with a package body 30 by a molding process identical to that used in conventional molding of IC packages. Third, as shown in FIG. 3, the base frame 20 is separated from the encapsulated chip 10 in a way that transfers the copper lands 22 and the inner solder bumps 24 from the base frame 20 to the chip 10. Finally, as shown in FIG. 4, solder balls 40 are attached to the exposed surfaces of the transferred copper lands 22.

FIG. 5 shows in greater detail the chip 10 with an external solder ball 40. The chip 10 has a bonding pad 12 formed on its active surface. The bonding pad 12 and the external solder ball 40 are connected through wiring conductor pattern 50, UBM 12, inner solder bump 24 and transferred copper land 22. The package body 30 is capable of providing stress relief in the solder joints due to CTE mismatch between chip and substrate. The CSP shown in FIG. 4 has advantages of compact package size, good electrical performance, and high reliability. However, as can be appreciated from the above prior art processes, the method of making CSP 100 is rather complex and costly.

SUMMARY OF THE INVENTION

It is therefore an object of the present invention to overcome, or at least reduce the problems and disadvantages associated with the above-described technique for fabricating a molded chip scale package.

It is a further objective of the present invention to provide a simplified method which can be used to produce a molded chip scale package.

The method of making a chip scale package in accordance with the present invention comprising the following steps: (a) providing a semiconductor chip having a plurality of metal bumps formed on the active surface thereof; (b) providing a metal plate having a plurality of flip-chip pads formed on a surface thereof; (c) positioning the semiconductor chip on the surface of the metal plate with the metal bumps on the chip aligned with the flip-chip pads on the metal plate; (d) connecting the metal bumps on the active surface of the semiconductor chip to the flip-chip pads on the surface of the metal plate; (e) encapsulating the semiconductor chip against a portion of the surface of the metal plate; (f) removing the metal plate while leaving the flip-chip pads intact; and (g) forming a plurality of solder balls on the flip-chip pads.

Using the technique of the present invention, it becomes possible that the manufacture of a molded chip scale package can be relatively simplified and economical, yet highly reliable.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

FIGS. 6–10 disclose a method of making a molded CSP according to a preferred embodiment of the present invention.

Figure 1:
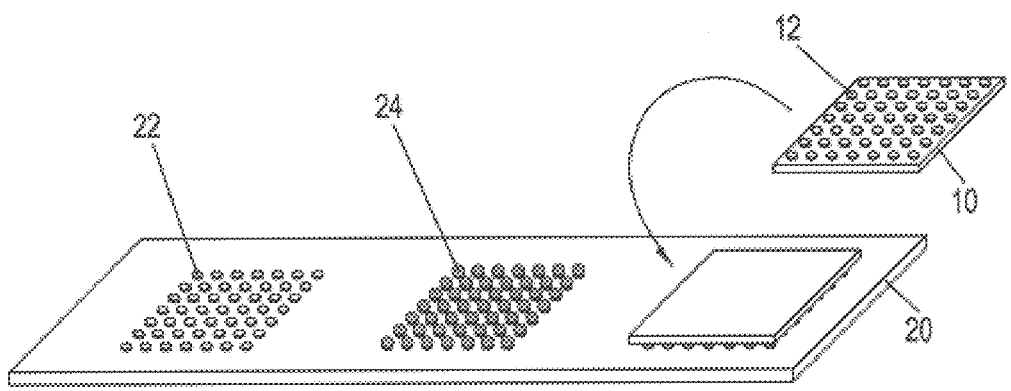
FIGS. 1–4 illustrate a conventional method of making a molded chip scale package (CSP)
Figure 2:
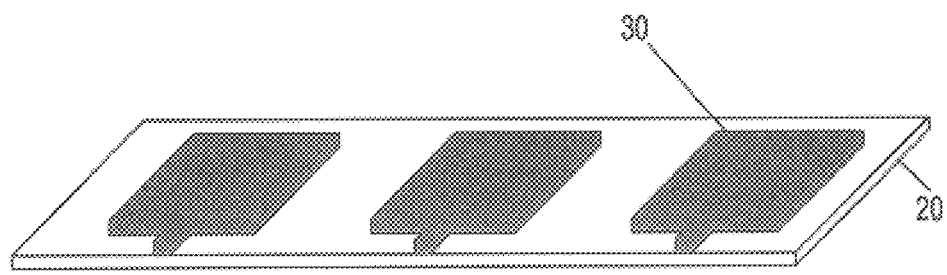
Figure 3:
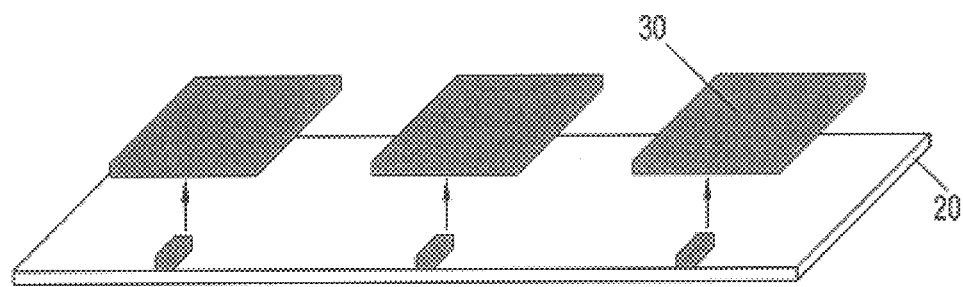
Figure 4:
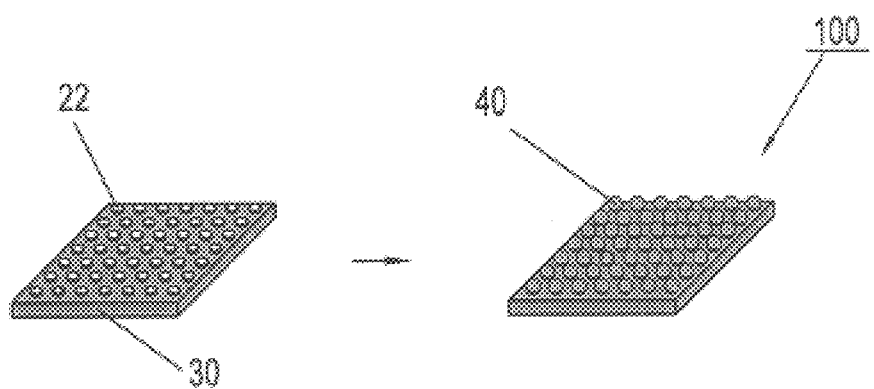
Figure 5:
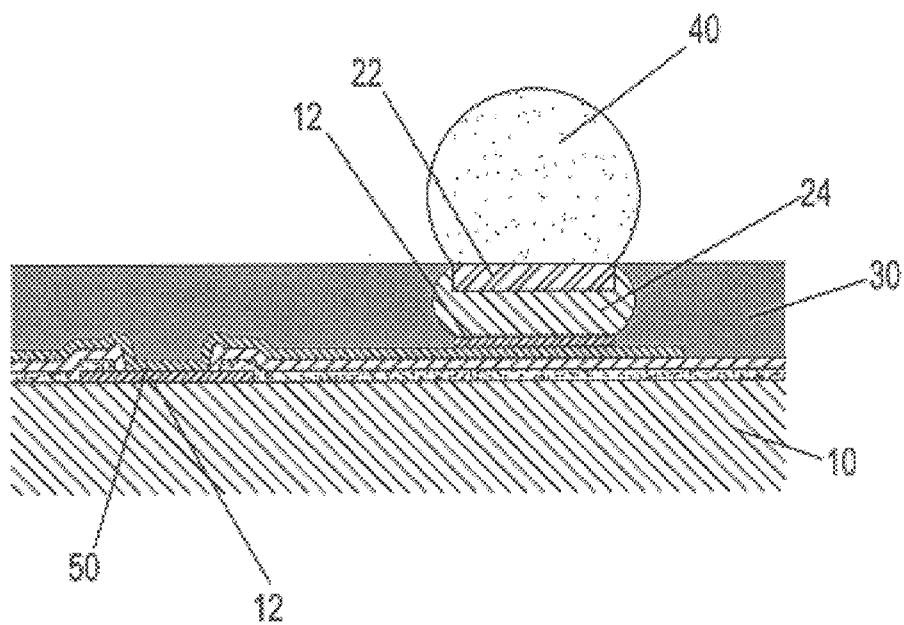
FIG. 5 is a detailed cross sectional view of the CSP shown in FIG. 4.
Figure 6:
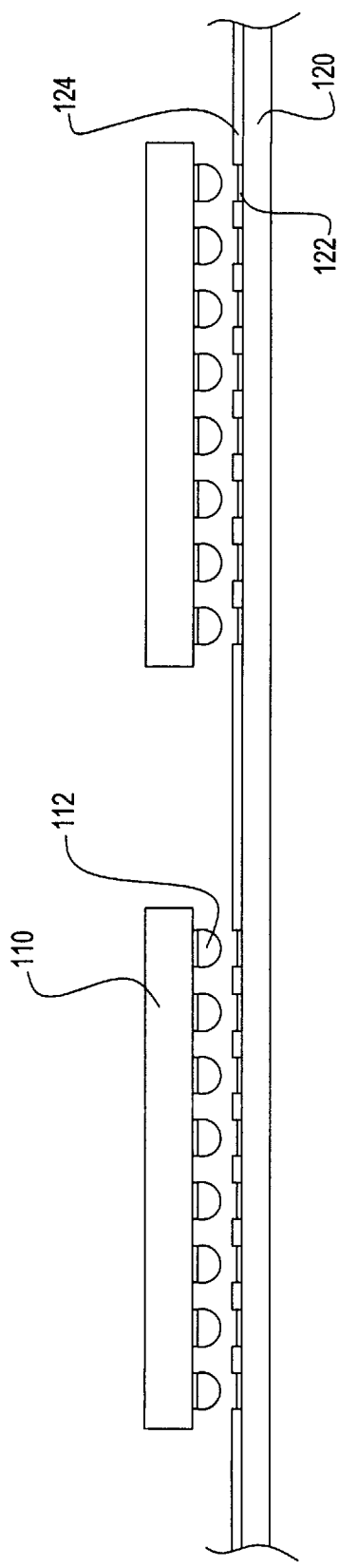
FIGS. 6–10 show a method of making a molded CSP according to a preferred embodiment of the present invention.

FIG. 6 shows a semiconductor chip 110 having a plurality of metal bumps 112 formed on the active surface thereof and a metal plate 120 having a plurality of flip-chip pads 122 formed on a surface thereof.

Flip-chip bumping technology typically comprises (a) forming an under bump metallurgy (UBM) on bonding pads of the chip, and (b) forming metal bumps on the UBM. Typically, UBM is consisted of three metal layers, including: (a) adhesion layer (formed of Ti, Cr or TiW) for purposes of providing a good adhesion to Al pad and passivation layer; (b) wetting layer (formed of Ni, Cu, Mo or Pt) wherein that kind of metals provide a higher wetting power to solder thereby allowing for proper wetting of solder during solder-reflow process; (c) protective layer formed of Au for purposes of preventing oxidation of the wetting layer thereby maintaining good wetting ability of the wetting layer to solder. Conventional ways to form a multi-layer under bump metallurgy (UBM) 34 mainly comprises chemical vapor deposition (CVD), plasma-enhanced chemical vapor deposition (PECVD), or physical vapor deposition (PVD) (sputtering or evaporation). Typically, there are two kinds of metal compositions used to form the metal bump. They includes (a) high melting point solder alloys such as 5Sn/95Pb or 3Sn/97Pb and (b) lower melting point solder alloys such as 63Sn/37Pb or 40Sn/60Pb. The metal bumps 112 of the present invention are preferably formed of the high melting point solder alloys. Bumping process is typically accomplished by vapor deposition, electroplating or printing. Recently, under cost consideration, a technique called "low cost bumping technology" is developed wherein the concepts of the technique comprise forming the UBM by electroless nickel/copper plating and then flip-chip bumping by printing. It could be understood that the UBM may be directly formed on the bonding pad of the chip, and then the metal bumps are formed on the UBM. Alternatively, when a single- or multi-layer metallization is employed to route the center or peripheral chip bonding pads to the desired package I/O pattern, the UBM is formed on the new I/O pattern, and then the metal bumps are formed on the UBM.

The metal plate 120 of the present invention may be formed from the following steps. Firstly, a solder mask 124 such as photoimagable solder mask or dry film solder mask is applied over the surface of the metal plate 120, then imaged and developed. Preferably, the solder mask 124 is formed with a thickness of about 4 to 6 mils. A photomask is used to image only certain area of the solder mask 124 which, when developed, are removed to leave predetermined areas exposed. Secondly, by using conventional plating techniques, a metal coating is formed on the exposed areas on the metal plate 120 thereby forming a plurality of flip-chip pads 122 on the surface of the metal plate 120. Preferably, the metal plate 120 is made of copper, and the metal coating is formed from gold (or palladium).

Referring to FIG. 6, the semiconductor chips 110 are positioned on the surface of the metal plate 120 with the metal bumps 112 on the chip 110 aligned with the flip-chip pads 122 on the metal plate 120.

Figure 7:
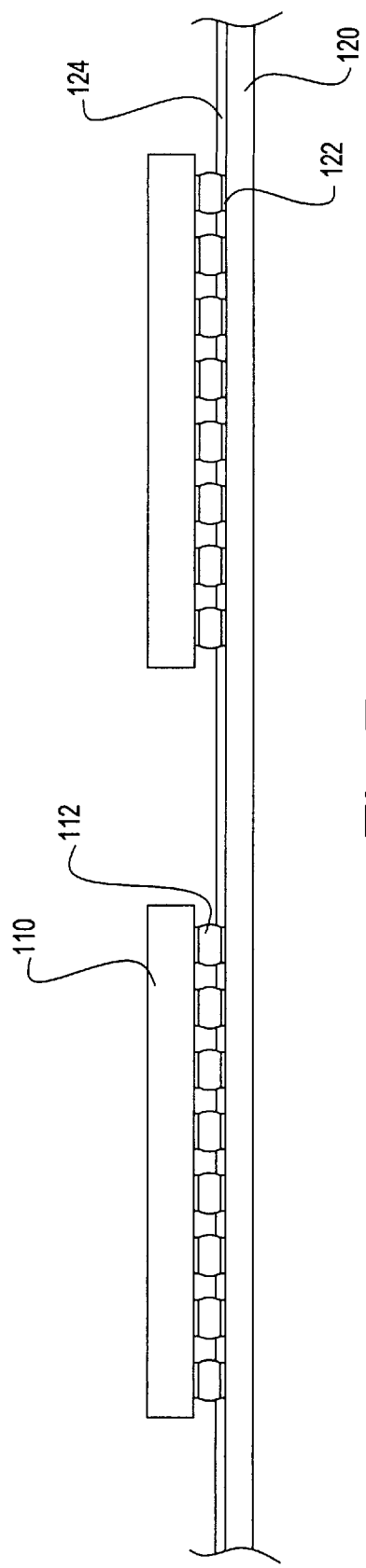

Referring to FIG. 7, after placement of the semiconductor chip 110 on the metal plate 120, both the chip 110 and the metal plate 120 undergo a thermal operation to reflow the metal bumps 112 to the flip-chip pads 122 on the metal plate 120. In the soldering, the solder mask 124 helps to prevent the bridging of fine-pitch solder bumps 112. Upon reflowing, both physical and electrical connection is made between the semiconductor chip 110 and the metal plate 120. A common method for solder reflowing is to put the object in a hot-air furnace or in an infrared heating reflow furnace.

Figure 8:
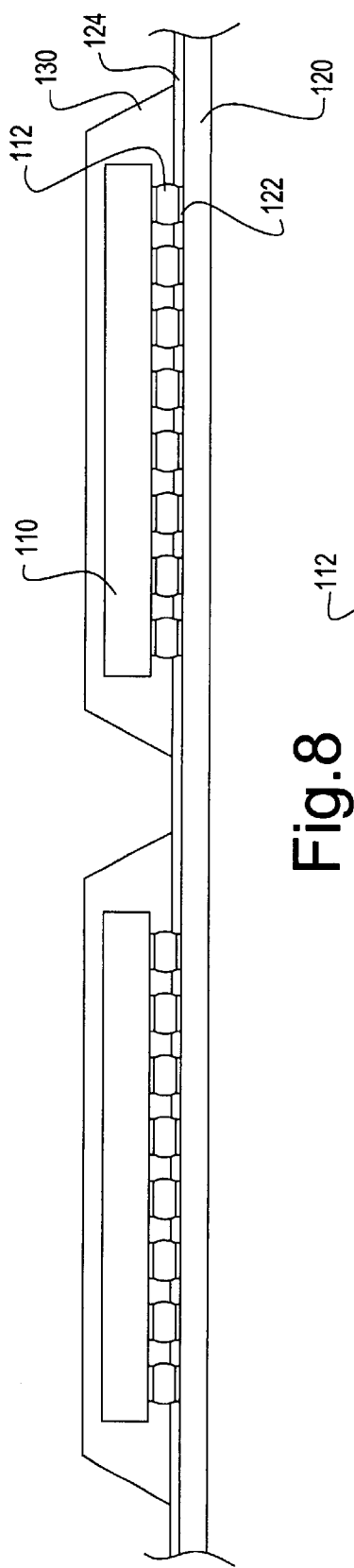

Referring to FIG. 8, the semiconductor chips 110 and portions of metal plate 120 are encapsulated in package bodies 130 by a molding process identical to that used in conventional molding of IC packages. This is accomplished by placing the semiconductor chip 110 in a mold having cavities and thereafter pouring molding compound into the mold to fill the mold cavities.

Figure 9:
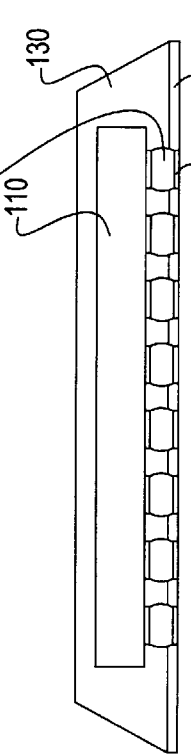

Finally, a separation step is performed to remove the metal plate 120. As shown in FIG. 9, the separation step typically comprises selectively etching the metal plate 120 with the flip-chip pads 124 remaining intact by an etching agent.

Figure 10:
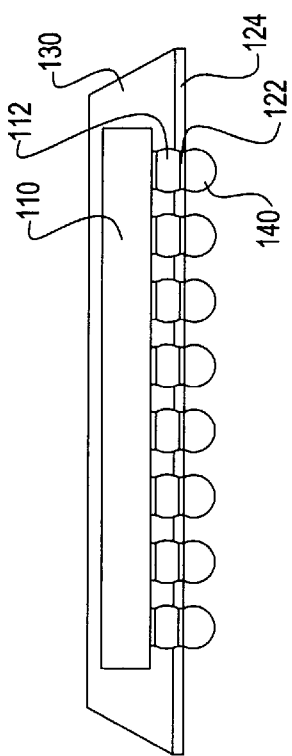

Referring to FIG. 10, the solder balls 140 can be formed on the exposed lower surfaces of flip-chip pads 122 by solder ball placing technique or stencil printing process. The solder balls 140 act as external I/O electrodes of the chip scale package in accordance with the present invention. When the CSP of the present invention is installed on an external substrate, the package body 130 is capable of providing stress relief in the solder joints due to CTE mismatch between chip and substrate.

The metal bumps 112 of the chip 110 are connected to the external solder balls 140 through the flip-chip pads 122. It should be understood that the metal bumps 122 may be directly disposed on the bonding pads of the chip 110 (as shown in FIG. 10) through an under bump metallurgy (UBM). Alternatively, the metal bumps 122 may be connected to the center or peripheral chip bonding pads on a chip through a single- or multi-layer metallization (not shown).

The method of making a chip scale package of the present invention allows the manufacture of a molded chip scale package to be relatively simplified and economical, yet highly reliable.

Although the invention has been explained in relation to its preferred embodiment, it is to be understood that many other possible modifications and variations can be made without departing from the spirit and scope of the invention as hereinafter claimed.

What is claimed is:

1. A method of making a chip scale package comprising the steps of:

providing a semiconductor chip having a plurality of metal bumps formed on the active surface thereof;

providing a metal plate having a plurality of flip-chip pads formed on a surface thereof;

positioning the semiconductor chip on the surface of the metal plate with the metal bumps on the chip aligned with the flip-chip pads on the metal plate;

connecting the metal bumps on the active surface of the semiconductor chip to the flip-chip pads on the surface of the metal plate;

encapsulating the semiconductor chip against a portion of the surface of the metal plate; and removing the metal plate while leaving the flip-chip pads intact.

2. The method as claimed in claim 1, further comprising the step of forming a plurality of solder balls on the flip-chip pads.

3. The method as claimed in claim 1, wherein the metal pate is made of copper and is removed by etching.

4. The method as claimed in claim 3, wherein the flip-chip pads are formed from metal selected from the group consisted of gold and palladium.

5. A method of making a chip scale package comprising the steps of:

providing a semiconductor chip having a plurality of metal bumps formed on the active surface thereof;

providing a metal plate;

forming a solder mask on a surface of the metal plate in a manner that predetermined areas on the surface of the metal plate are exposed from the solder mask;

forming a metal coating on the exposed areas of the metal plate so as to form a plurality of flip-chip pads on the surface of the metal plate;

positioning the semiconductor chip on the surface of the metal plate with the metal bumps on the chip aligned with the flip-chip pads on the metal plate;

connecting the metal bumps on the active surface of the semiconductor chip to the flip-chip pads on the surface of the metal plate;

encapsulating the semiconductor chip against a portion of the surface of the metal plate; and removing the metal plate while leaving the flip-chip pads intact.

6. The method as claimed in claim 5, further comprising the step of forming a plurality of solder balls on the flip-chip pads.

7. The method as claimed in claim 5, wherein the metal pate is made of copper and is removed by etching.

8. The method as claimed in claim 7, wherein the metal coating are formed from metal selected from the group consisted of gold and palladium.

* * * * *